United States Patent
Liu et al.

(10) Patent No.: US 9,059,214 B2
(45) Date of Patent: Jun. 16, 2015

(54) MANUFACTURING METHOD FOR THIN FILM TRANSISTOR WITH POLYSILICON ACTIVE LAYER

(75) Inventors: Zheng Liu, Beijing (CN); Chunping Long, Beijing (CN); Chunsheng Jiang, Beijing (CN); Jun Cheng, Beijing (CN); Lei Shi, Beijing (CN); Dongfang Wang, Beijing (CN); Yinan Liang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 28 days.

(21) Appl. No.: 13/469,567

(22) Filed: May 11, 2012

(65) Prior Publication Data

US 2012/0289007 A1 Nov. 15, 2012

(30) Foreign Application Priority Data

May 13, 2011 (CN) .......................... 2011 1 0124783

(51) Int. Cl.
*H01L 21/336* (2006.01)
*H01L 29/66* (2006.01)
*H01L 27/12* (2006.01)

(52) U.S. Cl.
CPC ........ *H01L 29/6675* (2013.01); *H01L 27/1277* (2013.01)

(58) Field of Classification Search
CPC ..................... H01L 27/1277; H01L 29/6675
USPC ................................................ 438/166, 486
See application file for complete search history.

(56) References Cited

U.S. PATENT DOCUMENTS

| 6,097,037 | A | 8/2000 | Joo et al. |
| 6,218,219 | B1 | 4/2001 | Yamazaki et al. |
| 6,586,287 | B2 * | 7/2003 | Joo et al. ........................ 438/166 |
| 6,864,130 | B2 * | 3/2005 | Koo et al. ..................... 438/166 |
| 7,253,036 | B2 * | 8/2007 | Paik .............................. 438/149 |

(Continued)

FOREIGN PATENT DOCUMENTS

| CN | 1453882 A | 3/1999 |
| CN | 101110365 A | 1/2008 |

(Continued)

OTHER PUBLICATIONS

EPO Communication Search Report dated Jun. 27, 2012, Appln. No. 12167749.6-1528.

(Continued)

*Primary Examiner* — Earl Taylor
(74) *Attorney, Agent, or Firm* — Ladas & Parry LLP

(57) ABSTRACT

Embodiments of the disclosed technology relate to a method for manufacturing a thin film transistor (TFT) with a polysilicon active layer comprising: depositing an amorphous silicon layer on a substrate, and patterning the amorphous silicon layer so as to form an active layer comprising a source region, a drain region and a channel region; depositing an inducing metal layer on the source region and the drain region; performing a first thermal treatment on the active layer provided with the inducing metal layer so that the active layer is crystallized under the effect of the inducing metal; doping the source region and the drain region with a first impurity for collecting the inducing metal; and performing a second thermal treatment on the doped active layer so that the first impurity absorbs the inducing metal remained in the channel region.

11 Claims, 4 Drawing Sheets

(56) References Cited

U.S. PATENT DOCUMENTS

| | | | |
|---|---|---|---|
| 7,390,705 B2* | 6/2008 | Paik | 438/166 |
| 7,407,841 B2* | 8/2008 | Seo et al. | 438/150 |
| 7,423,309 B2* | 9/2008 | Park et al. | 257/296 |
| 7,449,397 B2* | 11/2008 | Ro et al. | 438/479 |
| 7,521,303 B2* | 4/2009 | Paik | 438/166 |
| 7,569,440 B2* | 8/2009 | Yamazaki et al. | 438/166 |
| 7,709,840 B2* | 5/2010 | Lee | 257/59 |
| 7,714,391 B2* | 5/2010 | Kim et al. | 257/368 |
| 7,749,826 B2* | 7/2010 | Paik | 438/166 |
| 7,772,061 B2* | 8/2010 | Park et al. | 438/210 |
| 7,923,736 B2* | 4/2011 | Lee | 257/72 |
| 2002/0043662 A1 | 4/2002 | Yamazaki et al. | |
| 2002/0058365 A1* | 5/2002 | Lee et al. | 438/166 |
| 2002/0137267 A1* | 9/2002 | Joo et al. | 438/166 |
| 2002/0142528 A1* | 10/2002 | Joo et al. | 438/166 |
| 2003/0122129 A1 | 7/2003 | Yamazaki et al. | |
| 2003/0201442 A1* | 10/2003 | Makita | 257/66 |
| 2003/0203123 A1* | 10/2003 | Shang et al. | 427/569 |
| 2004/0263707 A1* | 12/2004 | Seo et al. | 349/43 |
| 2005/0012096 A1 | 1/2005 | Yamazaki et al. | |
| 2005/0105037 A1* | 5/2005 | Kim et al. | 349/151 |
| 2005/0110089 A1* | 5/2005 | Kim et al. | 257/347 |
| 2005/0250267 A1* | 11/2005 | Paik | 438/166 |
| 2005/0250286 A1* | 11/2005 | Paik | 438/288 |
| 2006/0001025 A1* | 1/2006 | Park et al. | 257/66 |
| 2006/0003504 A1* | 1/2006 | Paik | 438/151 |
| 2006/0071211 A1* | 4/2006 | Lee | 257/59 |
| 2006/0121655 A1* | 6/2006 | Paik | 438/166 |
| 2006/0270129 A1* | 11/2006 | Paik | 438/166 |
| 2007/0019123 A1* | 1/2007 | Seo et al. | 349/43 |
| 2007/0099352 A1* | 5/2007 | Ro et al. | 438/149 |
| 2007/0138468 A1* | 6/2007 | Yamazaki et al. | 257/57 |
| 2007/0284581 A1 | 12/2007 | Yang et al. | |
| 2008/0286912 A1* | 11/2008 | Park et al. | 438/155 |
| 2009/0029509 A1* | 1/2009 | Yamazaki et al. | 438/166 |
| 2010/0144077 A1* | 6/2010 | Yamazaki et al. | 438/34 |
| 2010/0193779 A1* | 8/2010 | Lee | 257/40 |
| 2011/0248277 A1* | 10/2011 | Lee et al. | 257/66 |
| 2012/0289007 A1* | 11/2012 | Liu et al. | 438/158 |

FOREIGN PATENT DOCUMENTS

| | | |
|---|---|---|
| KR | 20020088276 A | 11/2002 |
| KR | 100634724 B1 | 10/2006 |
| KR | 1020070040523 A | 4/2007 |
| KR | 100770268 B1 | 10/2007 |

OTHER PUBLICATIONS

KIPO Office Action dated Jul. 15, 2013; Appln. No. 10-2012-0050435.

First Chinese Office Action dated Mar. 31, 2014; Appln. No. 201110124783.0.

KIPO Notice of Rejection dated Jan. 27, 2014 Appln. No. 10-2012-0050435.

Korean Notice of Allowance dated Nov. 27, 2014; Appln. No. 10-2012-0050435.

Second Chinese Office Action dated Dec. 15, 2014; Appln. No. 201110124783.0

* cited by examiner

MANUFACTURING METHOD FOR THIN FILM TRANSISTOR WITH POLYSILICON ACTIVE LAYER

CROSS REFERENCE TO RELATED APPLICATIONS

This application claims the benefit to Chinese Application No. 201110124783.0, filed May 13, 2011, the entire disclosure of which is incorporated herein by reference.

BACKGROUND

Embodiments of the disclosed technology relate to a manufacturing method for a thin film transistor with a polysilicon active layer.

Polysilicon has relatively high carrier mobility (10-300 $cm^2IVs$) due to its regularly arranged atoms. Meanwhile, thin film transistors (TFTs) with a polysilicon active layer have a relatively high driving current, which can reduce the response time of liquid crystal in a liquid crystal display employing such TFTs. Thus, the volume of the TFTs can be reduced and the aperture ratio of the liquid crystal display can be increased so as to obtain higher brightness and higher resolution. Such advantages of the TFTs with polysilicon are also favorable for an active matrix organic light-emitting display (AMOLED). Instead of a voltage driving manner of liquid crystal displays, a current driving manner is employed in an AMOLED; in such a case, only the polysilicon TFT can meet its requirements. In addition, a remarkable advantage of polysilicon is that a driving integrated circuit (IC) using polysilicon can be integrated onto a panel, even in a system on glass (SOG), so that the product has advantages such as light weight, slim shape, and low power consumption.

A conventional manufacturing method for polysilicon is as follows. A layer of amorphous silicon (a-Si) is firstly deposited onto a glass substrate, and then the amorphous silicon is crystallized through an annealing thermal treatment. However, this method requires long time of annealing at a temperature higher than 600° C., and is not suitable for a glass substrate of a display. Furthermore, it has been found that some metals can function as catalysts for promoting crystal growth, and the crystallization temperature of the a-Si can be decreased by depositing a layer of metal on the a-Si. This method is called metal-induced crystallization (MIC) method. The MIC method can decrease the crystallization temperature to 500° C. or less. However, there is a serious problem when the MIC is applied to manufacture TFTs, i.e., the metal atoms tends to remain in the channel regions of TFTs as impurity atoms, which leads to current leakage in the channel regions and deteriorates the characteristics of the TFTs.

In addition, another metal-induced crystallization phenomenon is found, in which the crystal can laterally grow by 100 μm or more towards a region without being covered by the metal layer. This phenomenon is called as metal-induced lateral crystallization (MILC). The MILC can be performed under the induction effect by various metals such as nickel, and the crystallization temperature can be less than 500° C. In this case, strip shaped crystal grains can be formed with a relatively large size.

FIGS. 1A and 1B are schematic views showing a manufacturing method for a polysilicon TFT by a MILC process in the prior art. Referring to FIGS. 1A and 1B, the manufacturing method comprises the following steps. First, a buffer layer 102 is deposited on a glass substrate 101 through a plasma enhanced chemical vapor deposition (PECVD) method. The material of the buffer layer may be, for example, silicon dioxide ($SiO_2$). Then, an amorphous silicon layer 103 is deposited on the buffer layer 102 through a PECVD or a low pressure chemical vapor deposition (LPCVD) method. Subsequently, an inducing metal layer of nickel is deposited on selected positions on the amorphous layer 103 (for example, positions for forming source/drain regions of the TFT structures in the subsequent steps) through a sputtering method. Finally, an annealing treatment is performed, generally for the annealing time of 0.1-10 hours. During the annealing process, MIC occurs firstly in the regions where the amorphous silicon and the metal nickel contact with each other directly so as to form MIC polysilicon regions, which are indicated by "103S" and "103D" in FIG. 1B. Subsequently, the polysilicon crystal grains laterally grow into amorphous regions not contacting with the metal nickel directly so as to form a MILC polysilicon region 103C as shown in FIG. 1B. Because of not contacting with the metal directly, the MILC polysilicon region has a much lower metal impurity concentration than the MIC polysilicon region.

SUMMARY

An embodiment of the disclosed technology provides a method for manufacturing a thin film transistor (TFT) with a polysilicon active layer comprising: depositing an amorphous silicon layer on a substrate, and patterning the amorphous silicon layer so as to form an active layer comprising a source region, a drain region and a channel region; depositing an inducing metal layer on the source region and the drain region; performing a first thermal treatment on the active layer provided with the inducing metal layer so that the active layer is crystallized under the effect of the inducing metal; doping the source region and the drain region with a first impurity for collecting the inducing metal; and performing a second thermal treatment on the doped active layer so that the first impurity absorbs the inducing metal remained in the channel region.

Further scope of applicability of the disclosed technology will become apparent from the detailed description given hereinafter. However, it should be understood that the detailed description and specific examples, while indicating preferred embodiments of the disclosed technology, are given by way of illustration only, since various changes and modifications within the spirit and scope of the disclosed technology will become apparent to those skilled in the art from the following detailed description.

BRIEF DESCRIPTION OF THE DRAWINGS

The disclosed technology will become more fully understood from the detailed description given hereinafter and the accompanying drawings which are given by way of illustration only, and thus are not limitative of the disclosed technology and wherein.

DETAILED DESCRIPTION

Embodiments of the disclosed technology now will be described more clearly and fully hereinafter with reference to the accompanying drawings, in which the embodiments of the disclosed technology are shown. Apparently, only some embodiments of the disclosed technology, but not all of embodiments, are set forth here, and the disclosed technology may be embodied in other forms. All of other embodiments made by those skilled in the art based on embodiments disclosed herein without mental work fall within the scope of the disclosed technology.

Figure 1A:
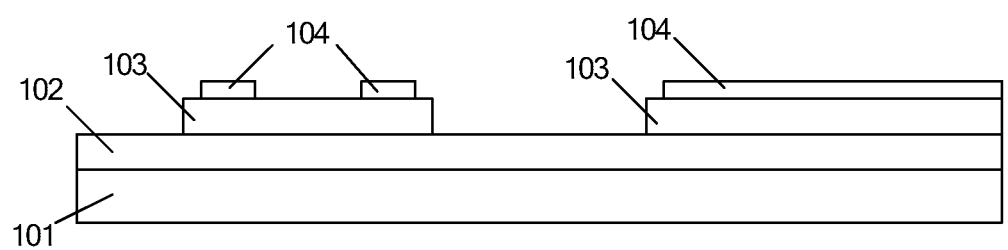
FIGS. 1A and 1B are schematic views showing a manufacturing method for polysilicon thin film transistor (TFT) by a MILC process in the prior art.
Figure 1B:
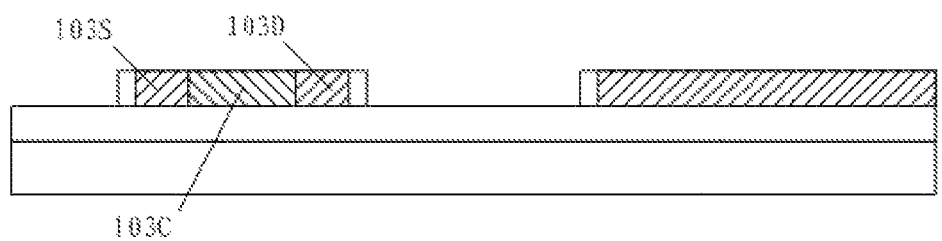
Figure 2:
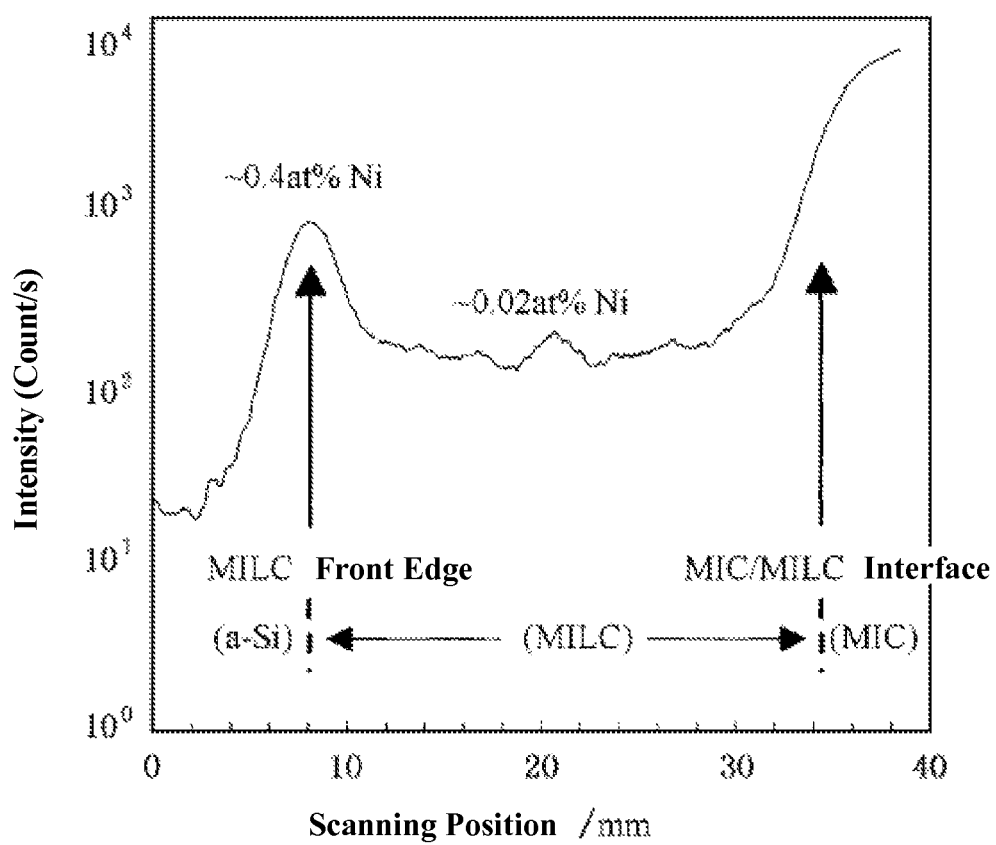
FIG. 2 is a diagram showing a one-dimensional distribution of the nickel in regions of MIC, MILC and a-Si obtained by a secondary ion mass spectroanalyzer (SIMS)

A method for manufacturing a polysilicon TFT by an MILC process is described above. However, the TFT manufactured by the above MILC process still have a relatively large leakage current, which is mainly due to existence of the regions with relatively high nickel concentration such as lateral grain boundaries between the MILC region and the MIC regions at the two ends (or sides) of a channel region 103C and lateral grain boundaries between the grains formed by the MILC in the channel region. FIG. 2 is a diagram showing a one-dimensional distribution of the nickel in the regions of MIC, MILC, and a-Si obtained by a secondary ion mass spectroanalyzer (SIMS). It can be seen from FIG. 2 that the nickel concentration in the MILC region is the lowest, the nickel concentration at locations between the grains at the front edge of the MILC region is relatively higher, and the nickel concentration near the MIC/MILC interfaces is the highest.

A manufacturing method for a thin film transistor (TFT) with a polysilicon active layer according to an embodiment of the disclosed technology comprises the following steps.

Step 301, depositing a buffer layer on a substrate.

Figure 3A:
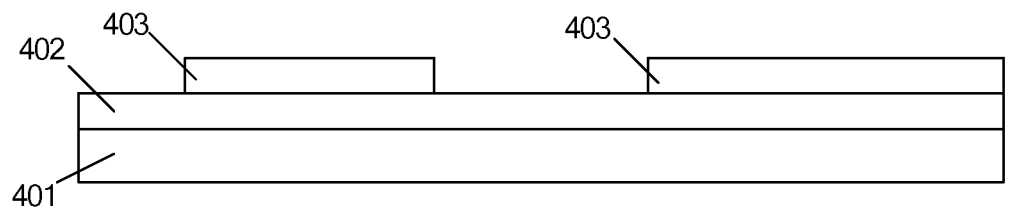
FIGS. 3A-3E are diagrams showing a manufacturing method of a thin film transistor with a polysilicon active layer according to an embodiment of the disclosed technology.

As shown in FIG. 3A, a buffer layer 402 is formed on a pre-cleaned transparent substrate 401 such as a glass plate or a silica plate through a plasma enhanced chemical vapor deposition (PECVD), a low pressure chemical vapor deposition (LPCVD), an air pressure chemical vapor deposition (APCVD), an electron cyclotron resonance chemical vapor deposition (ECR-CVD) or a sputtering method. The buffer layer 402 is used to block impurities contained in the glass plate from entering into the active layer so as to avoid any disadvantageous influence by the impurities on the characteristics of the TFT element such as threshold voltage and current leakage.

The buffer layer can be a single layer of silicon oxide, silicon nitride or a stacked layer thereof The buffer layer may have a thickness of 300-10000 Å, for example, 500-4000 Å. The buffer layer can be deposited at a temperature of 600° C. or less. In consideration of the high concentration of metal impurities such as aluminum (Al), barium (Ba) and sodium (Na) which can easily diffuse during high temperature treatment processes in the conventional alkali glass, the glass substrate can employ, for example, an alkali-free glass in addition to introducing the buffer layer for avoiding the influence of impurities from the substrate.

Step 302, depositing an amorphous silicon layer on the buffer layer 402, and patterning the amorphous silicon layer so as to form an active layer comprising a source region, a drain region and a channel region.

As shown in FIG. 3A, an amorphous layer 403 is deposited on the buffer layer 402, a mask (e.g., a photoresist mask) is formed by a lithography process, and the pattern of the active layer of the TFT is formed by a dry etching method. The active layer can have a thickness of 100-3000 Å, for example, 500-1000 Å. The amorphous silicon layer can be formed by a PECVD, a LPCVD or a sputtering method. The amorphous silicon layer 403 can be deposited at a temperature of 600° C. or less. In addition, the patterning process and the deposition process for the amorphous layer is not limited to the processes as mentioned above, and can employ any of the known patterning processes or deposition processes.

Step 303, depositing an inducing metal layer on the source region and the drain region of the active layer, performing a thermal treatment on the active layer with the inducing metal layer so that MIC and MILC occur in the active layer under the effect of the inducing metal layer.

A mask (e.g., a photoresist mask) is formed by a lithography process so as to deposit an inducing metal layer on selected regions (the source region and the drain region) on the active layer. A thermal treatment is performed on the amorphous silicon covered by the inducing metal layer so as to generate MIC and MILC regions. The MIC region is formed on the regions directly covered by the inducing metal layer (the source region and the drain region), and the MILC region is formed in the region not covered by the inducing metal layer (the channel region). Thus, the amorphous silicon in the active layer is crystallized into polysilicon.

Figure 3B:
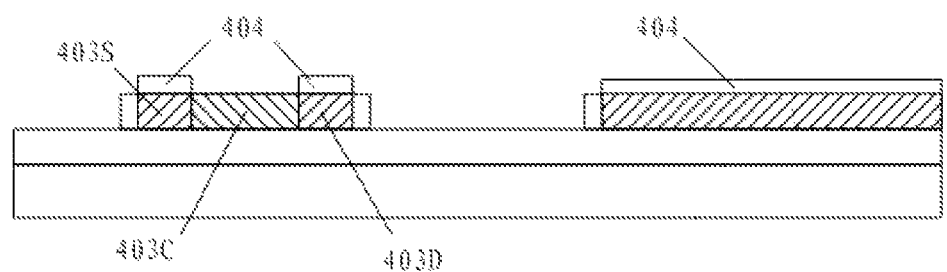

According to the embodiment of the disclosed technology, the induction crystallization is performed by covering the source region and the drain region of the TFT with the inducing metal so as to reduce contamination by the inducing metal on the channel region. As shown in FIG. 3B, in each TFT unit, two MIC regions 403S (the source region) and 403D (the drain region) are formed at the regions in the active layer directly covered by the inducing metal 404, and a MILC region 403C is formed at the channel region not covered by the inducing metal and between the source and drain regions. The inducing metal can be one selected from a group composed of nickel, copper, gold, silver, aluminum, cobalt, chromium and etc. In the present embodiment, nickel is employed as the inducing metal due to its better inducing effect, which is favorable for characteristics of the TFT. The nickel layer can be formed to a thickness of 1-10000 Å, for example, 10-200 Å, by a method such as sputtering, thermal evaporation, PECVD, atomic layer deposition (ALD) and etc. The thickness of the nickel layer can be controlled more precisely with the ALD method in general. The thermal treatment for generating the induction crystallization may be rapid thermal annealing (RTA), excimer laser annealing (ELA) or furnace annealing. In the present embodiment, the furnace annealing is employed at a temperature of 400-600° C. The annealing atmosphere can be nitrogen, hydrogen or vacuum, and the annealing time can be 0.1-50 hours. If a higher annealing temperature is used, then the annealing time can be reduced to 2 hours or less.

Step 304, forming patterns of a gate insulating layer and a gate electrode on the active layer after the thermal treatment.

Figure 3C:
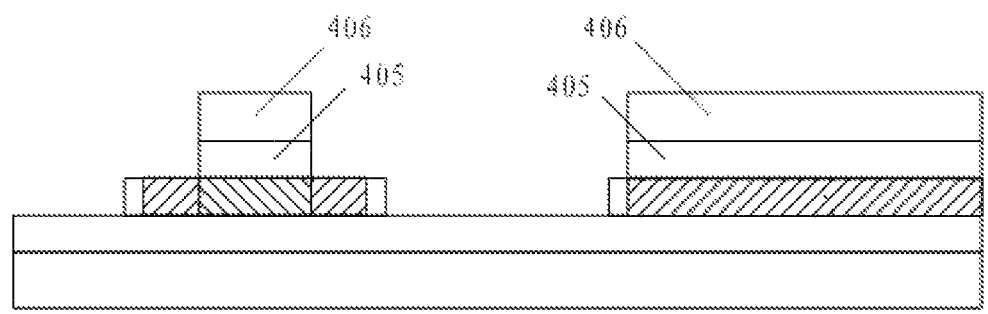

As shown in FIG. 3C, a gate insulating layer 405 is deposited firstly on the substrate formed with the active layer by a method such as PECVD, LPCVD, APCVD, or ECR-CVD. Then a conductive layer for forming the gate electrode 406 is deposited on the gate insulating layer 405 by a method such as PECVD, LPCVD, APCVD, or ECR-CVD. Finally, a mask is formed and the gate insulating layer 405 and a gate electrode layer 406 are etched into patterns by a wet etching or a dry etching method.

The gate insulating layer 405 has a thickness of 300-3000 Å and the thickness can be selected appropriately as required. The gate insulating layer 405 can be a single layer of silicon oxide, silicon nitride or a stacked layer thereof. The gate insulating layer can be deposited at a temperature of 600° C. or less. The gate electrode layer 406 is formed of a conductive layer such as metals, metal alloys, for example, molybdenum, molybdenum aluminum alloy, or doped polysilicon with a thickness of 1000-8000 Å, for example, 2500-4000 Å.

Step 305, doping the source region and the drain region with a first impurity for collecting the inducing metal by using the patterns of the gate insulating layer and the gate electrode as a mask.

In the active layer of the TFT manufactured by the steps 301 and 304, residual nickel with a relatively high concentration still exists between the MIC/MILC interface and the grain boundaries at the front edge of the MILC region, which will increase the "OFF" current of the TFT, i.e., the leakage current, and deteriorate the electrical characteristics of the TFT.

It has been found by research that phosphorus element has prosperity of absorbing the metal impurities such as nickel, iron, and copper in silicon, and particularly has a strong absorption effect on nickel. Therefore, a relatively low "OFF" current (10 pA or less) can be obtained by doping the polysilicon TFT with phosphorus. It has been also found by a further research that nitrogen or the mixture of nitrogen and oxygen also has the effect of absorbing nickel, gold or other metals. The process of doping phosphorus is a commonly used process in manufacturing the TFT and easy to be performed. In the step, for example, phosphorus elements are used as the first impurity. The residual nickel impurity in the channel region can be absorbed during the thermal treatment by doping the source/drain regions of the active layer with phosphorus, which decreases the "OFF" current of the TFT and improves the electrical characteristics of the TFT.

Ion implantation is a commonly used doping technology. As for the ion implantation technology, there are ion implantation with mass analyzer, ion cloud implantation without mass analyzer, plasma implantation, solid-state diffusion implantation and etc. In the embodiment, the ion cloud implantation is used for example.

Figure 3D:
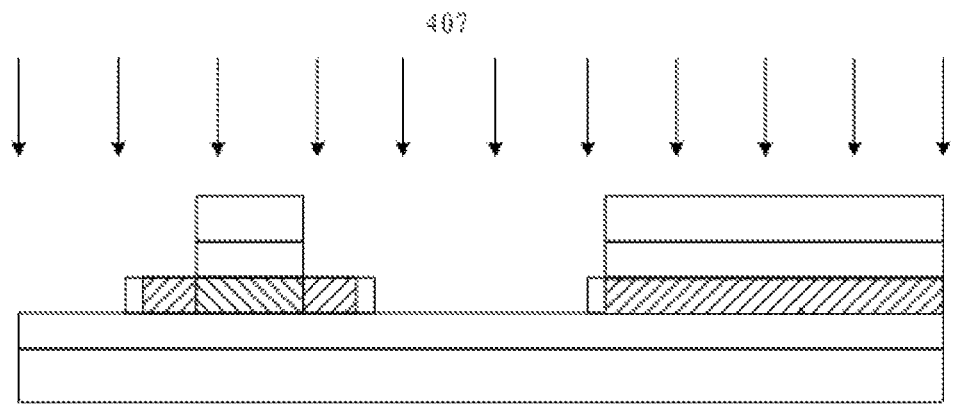

As shown in FIG. 3D, the source/drain regions of the TFT structure is lightly doped with phosphorus through an ion implantation method by using the patterns of the gate insulating layer and the gate electrode as a mask. In the embodiment, a mixed gas 407 of $PH_3/H_2$ is employed as the gas used for the ion implantation. A mass ratio of the $PH_3$ to the entire mixed gas 407 is 5%-15%. The ion implantation energy is 10-200 keV, for example, 40-100 keV. The implantation dose is $1\times10^{11}$–$1\times10^{20}$ atoms/cm$^3$, for example, $1\times10^{13}$–$8\times10^{15}$ atoms/cm$^3$.

Step 306, doping the source/drain regions with a second impurity by using the patterns of the gate insulating layer and the gate electrode layer as a mask. The second impurity is used to determine the conduction type of the source region and the drain region so as to form a P-type metal oxide semiconductor (PMOS) thin film transistor or an N-type metal oxide semiconductor (NMOS) thin film transistor.

The second impurity is boron (B), phosphorus (P) or arsenic (As), in which B element is used to form PMOS, and P or As elements are used to form NMOS. In the embodiment, the PMOS doped with B element is taken as an example.

Figure 3E:
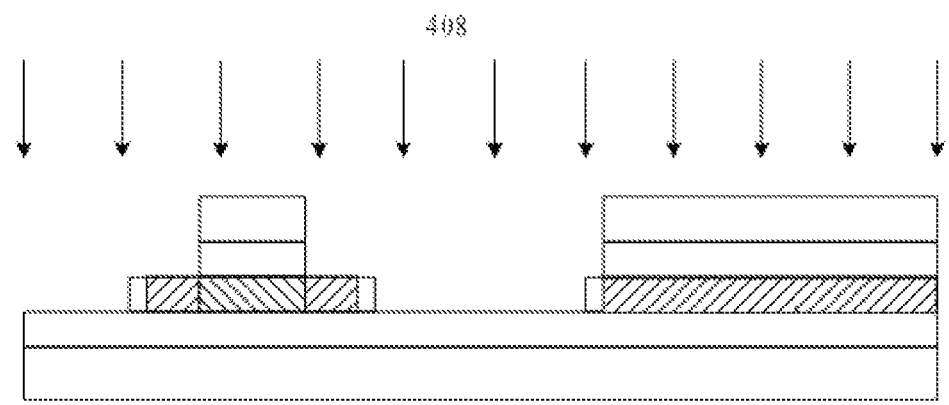

As shown in FIG. 3E, the source/drain regions of the TFT structure is heavily doped with boron through an ion implantation method by using the patterns of the gate insulating layer and the gate electrode as a mask. In the embodiment, a mixed gas 408 of $B_2H_6/H_2$ is employed as the gas used for the ion implantation. A mass ratio of the $B_2H_6$ to the entire mixed gas 408 is 5%-15%. The ion implantation energy is 10-200 keV, for example, 40-100 keV. The implantation dose is $1\times10^{11}$–$1\times10^{20}$ atoms/cm$^3$, for example, $1\times10^{13}$–$8\times10^{15}$ atoms/cm$^3$. The implantation dose should be larger, for example, 2-3 times larger, than the implantation dose of the phosphorus element. For example, if the implantation dose of the phosphorus element is $1\times10^{15}$ atoms/cm$^3$, then the implantation dose of the boron element is $2\times10^{15}$–$3\times10^{15}$ atoms/cm$^3$.

Step 307, performing a thermal treatment on the doped active layer so as to activate the second impurity and make the first impurity absorb the inducing metal remained in the channel region.

After the active layer is doped with the first impurity and the second impurity, an activation process can be performed on the TFT by a method such as RTA, ELA or furnace annealing. The furnace annealing is an economic and easy method with favorable uniformity. In the present embodiment, a furnace annealing at a temperature of 300-600° C. for 0.5-4 hours (for example, 1-3 hours) is employed as the activation thermal treatment. In the activation process, the phosphorus can absorb the nickel in the active layer. Since the phosphorus is only added in the source/drain regions, the nickel in the channel region moves towards the source/drain regions under the absorption effect of the phosphorus element, so that the residual nickel in the channel region is reduced and the electrical characteristics of the manufactured TFT is improved.

The manufacturing method according to an embodiment of the disclosed technology is described as above by taking a top gate TFT as an example; however, disclosed technology can also be applied in manufacturing a bottom gate TFT. The bottom gate TFT is manufactured similarly to the top TFT but with the following differences: the amorphous silicon being deposited on the substrate formed with the gate electrode and the gate insulating layer, and an additional mask being needed for doping the first and second impurities in the source region and the drain region.

In view of the above, according to the disclosed technology, after the MILC process is performed on the amorphous silicon in the active layer of the TFT, the source/drain regions are doped with the impurity for absorbing the inducing metal, and then the inducing metal remained in the channel region is absorbed by the impurity doped in the source/drain region under a condition of thermal treatment so that the inducing metal in the channel region moves towards the source/drain regions. Thus, the concentration of the inducing metal remained in the channel region is decreased, which leads to a reduced leakage current of the polysilicon TFT and an improved electrical characteristic of the polysilicon TFT.

Another embodiment of the disclosed technology provides a thin film transistor manufactured by the method according to any embodiments of the disclosed technology.

Still another embodiment of the disclosed technology provides an array substrate comprising a thin film transistor manufactured by the method according to any of the embodiments of the disclosed technology.

It should be noted that the above embodiments only have the purpose of illustrating the disclosed technology, but not limiting it. Although the disclosed technology has been described with reference to the above embodiment, those skilled in the art should understand that modifications or alternations can be made to the solution or the technical feature in the described embodiments without departing from the spirit and scope of the disclosed technology.

What is claimed is:

1. A method for manufacturing a thin film transistor (TFT) with a polysilicon active layer, comprising:
   depositing an amorphous silicon layer on a substrate, and patterning the amorphous silicon layer so as to form an active layer comprising a source region, a drain region and a channel region;
   depositing an inducing metal layer on the source region and the drain region;

performing a first thermal treatment on the active layer provided with the inducing metal layer so that the source region and the drain region are crystallized under the effect of the inducing metal by metal inducing crystallization (MIC) and the channel region is crystallized by metal-induced lateral crystallization (MILC);

doping the source region and the drain region with a first impurity for collecting the inducing metal, and doping the source region and the drain region with a second impurity according to the conductive type of the source region and the drain region; and performing a second thermal treatment on the doped active layer so that the first impurity absorbs the inducing metal remained in the channel region and the second impurity is activated by the second thermal treatment, wherein the inducing metal layer is deposited after the amorphous silicon layer is patterned.

2. The method of claim 1, wherein the first impurity is phosphorus, nitrogen or a mixture of nitrogen and oxygen.

3. The method of claim 2, wherein the second thermal treatment is performed at a temperature of 300-600° C. for 1-3 hours.

4. The method of claim 3, wherein the inducing metal is nickel, copper, gold, silver, aluminum, cobalt or chromium.

5. The method of claim 1, wherein the inducing metal layer is deposited to a thickness of 10-200 Å.

6. The method of claim 1, wherein the first thermal treatment is performed at a temperature of 400-600° C. for 0.1-50 hours.

7. The method of claim 1, wherein the doping dose of the second impurity is 2-3 times larger than that of the first impurity.

8. The method of claim 1, further comprising forming a buffer layer on the substrate before depositing the amorphous silicon layer, the amorphous silicon layer being deposited on the buffer layer.

9. The method of claim 1, further comprising before the source region and the drain region are doped with the first impurity and the second impurity, forming patterns of a gate insulating layer and a gate electrode, wherein the source region and the drain region are doped with the first impurity and the second impurity by using the patterns of the gate insulating layer and the gate electrode as a mask.

10. The method of claim 1, further comprising before depositing the amorphous silicon layer, forming a gate electrode and a gate insulating layer on the substrate, wherein the amorphous silicon layer is formed above the gate electrode and the gate insulating layer.

11. The method of claim 1, wherein the source region and the drain region are doped with the first impurity and the second impurity through an ion implantation method with an ion implantation energy of 40-100 keV.

* * * * *